US008992756B2

(12) United States Patent
Yamamoto

(10) Patent No.: US 8,992,756 B2
(45) Date of Patent: *Mar. 31, 2015

(54) DIRECT PLATING METHOD AND SOLUTION FOR PALLADIUM CONDUCTOR LAYER FORMATION

(75) Inventor: Hisamitsu Yamamoto, Hirakata (JP)

(73) Assignee: C. Uyemura & Co., Ltd., Osaka-Shi (JP)

( * ) Notice: Subject to any disclaimer, the term of this patent is extended or adjusted under 35 U.S.C. 154(b) by 574 days.

This patent is subject to a terminal disclaimer.

(21) Appl. No.: 12/513,611

(22) PCT Filed: Nov. 6, 2006

(86) PCT No.: PCT/JP2006/322117
§ 371 (c)(1),
(2), (4) Date: May 5, 2009

(87) PCT Pub. No.: WO2008/056403
PCT Pub. Date: May 15, 2008

(65) Prior Publication Data
US 2010/0059386 A1    Mar. 11, 2010

(51) Int. Cl.
| | | |
|---|---|---|
| C25D 5/02 | (2006.01) | |
| C23C 18/44 | (2006.01) | |
| C25D 5/56 | (2006.01) | |
| H05K 3/18 | (2006.01) | |
| H05K 3/42 | (2006.01) | |
| C23C 18/16 | (2006.01) | |
| C23C 18/20 | (2006.01) | |
| C23C 18/30 | (2006.01) | |
| H05K 1/03 | (2006.01) | |

(52) U.S. Cl.
CPC . *C23C 18/44* (2013.01); *C25D 5/02* (2013.01); *C25D 5/56* (2013.01); *H05K 3/181* (2013.01); *H05K 3/422* (2013.01); *C23C 18/1653* (2013.01); *C23C 18/2086* (2013.01); *C23C 18/30* (2013.01); *H05K 1/0346* (2013.01); *H05K 3/427* (2013.01); *H05K 2201/0344* (2013.01); *H05K 2203/124* (2013.01)
USPC ............................. 205/118; 205/125; 205/187

(58) Field of Classification Search
CPC ........................................................ C25D 5/02
USPC .......................................... 205/118, 125, 187
See application file for complete search history.

(56) References Cited

U.S. PATENT DOCUMENTS

| | | | | | |
|---|---|---|---|---|---|
| 3,099,608 | A | * | 7/1963 | Radovsky et al. | 205/123 |
| 3,418,143 | A | * | 12/1968 | Sergienko | 106/1.28 |
| 3,793,038 | A | * | 2/1974 | Maguire | 427/443.1 |
| 3,871,903 | A | * | 3/1975 | Brandt et al. | 428/421 |
| 4,004,051 | A | | 1/1977 | Kadison et al. | |
| 4,248,632 | A | * | 2/1981 | Ehrich et al. | 106/1.11 |
| 4,804,410 | A | * | 2/1989 | Haga et al. | 106/1.15 |
| 4,969,979 | A | * | 11/1990 | Appelt et al. | 205/131 |
| 5,007,990 | A | | 4/1991 | Bladon | |
| 5,085,693 | A | * | 2/1992 | Josso et al. | 106/1.28 |
| 5,421,989 | A | | 6/1995 | Stamp et al. | |
| 5,632,927 | A | | 5/1997 | Ferrier et al. | |
| 5,882,736 | A | * | 3/1999 | Stein et al. | 427/96.6 |
| 6,235,093 | B1 | | 5/2001 | Okuhama et al. | 106/1.18 |
| 7,220,296 | B1 | * | 5/2007 | Chowdhury et al. | 106/1.23 |
| 2007/0232044 | A1 | * | 10/2007 | Chowdhury et al. | 438/597 |
| 2012/0171363 | A1 | * | 7/2012 | Yamamoto et al. | 427/99.1 |

FOREIGN PATENT DOCUMENTS

| | | |
|---|---|---|
| DE | 4438791 A1 | 4/1996 |
| DE | 19740431 C1 | 11/1998 |
| JP | 62-124280 A | 6/1987 |
| JP | 3-117216 A | 5/1991 |
| JP | 3-134178 A | 6/1991 |
| JP | 3-261569 A | 11/1991 |
| JP | 5-214551 A | 8/1993 |
| JP | 5-218644 A | 8/1993 |
| JP | 5-327187 A | 12/1993 |
| JP | 7-263843 A | 10/1995 |
| JP | 3284489 B2 | 9/1996 |
| JP | 2660002 B2 | 10/1997 |
| JP | 2799076 B2 | 9/1998 |

(Continued)

OTHER PUBLICATIONS

Chiang et al., "Formation of PdS Compounds in Direct Metallization via Pd/Sn Catalyst Activation", J. Electrochem. Soc., vol. 146, Issue 9, pp. 3255-3258, (Abstract) 1999.
Office Action issued Oct. 20, 2010 in corresponding Japanese Patent Application No. 2005-199589.
Chinese Office Action issued May 6, 2010, in Chinese Application No. 200680056449.3.
Encyclopedia of Surface Treatment Technology,Liu Yubo, China Metrology Press, ISBN 7-5026-0816-8, 1996, pp. 317-318.

(Continued)

*Primary Examiner* — Edna Wong
(74) *Attorney, Agent, or Firm* — Birch, Stewart, Kolasch & Birch, LLP

(57) ABSTRACT

A surface of an object to be plated is subjected to a treatment for palladium catalyst impartation to impart a palladium catalyst to the surface of an insulating part thereof. A palladium conductor layer is formed on the insulating part from a solution for palladium conductor layer formation which contains a palladium compound, an amine compound, and a reducing agent. On the palladium conductor layer is then directly formed a copper deposit by electroplating. Thus, the work is converted to a conductor with the solution for palladium conductor layer formation, which is neutral, without using an electroless copper plating solution which is highly alkaline. Consequently, the polyimide is prevented from being attacked and no adverse influence is exerted on adhesion. By adding an azole compound to the solution for palladium conductor layer formation, a palladium conductor layer is prevented from depositing on copper.

11 Claims, No Drawings

(56) References Cited

FOREIGN PATENT DOCUMENTS

| | | | | |
|---|---|---|---|---|
| JP | 2001-214278 A | 8/2001 | | |
| JP | 2001-339142 A | 12/2001 | | |
| JP | 2006-219757 A | 8/2006 | | |
| WO | WO 93/17153 A1 | 9/1993 | | |
| WO | WO-01/38604 A1 | 5/2001 | | |
| WO | WO 2005076681 A1 * | 8/2005 | .............. | H05K 3/46 |
| WO | WO-2006/075782 A1 | 7/2006 | | |

OTHER PUBLICATIONS

Practical Technology of Electroless Plating, "Section II, Electroless Palladium Plating, 1. Potential-pH Diagram Using Hypophosphite, Phosphite, Phosphate as Reducing Agent", ISBN 7-5025-4857-2, 2004, pp. 307-320.

European Search Report dated Jan. 25, 2012 for corresponding European Patent Application No. 06823030.9.

Office Action for corresponding Taiwanese Patent Application No. 095124528, dated Jan. 28, 2013.

* cited by examiner

DIRECT PLATING METHOD AND SOLUTION FOR PALLADIUM CONDUCTOR LAYER FORMATION

TECHNICAL FIELD

This invention relates to a direct plating process, which can conduct electrolytic copper plating to an insulating part of a workpiece to be plated directly without conducting electroless copper plating, is suited when imparting conductivity to insulating parts of through-holes (TH) and blind via-holes (BVH) of a printed circuit board or the like, and is effective especially when conducting copper plating to a rigid flex substrate or a full-surface resinous build-up substrate having a polyimide as a material, and also to a palladium conductor layer forming solution for use in the direct plating. In the context of this process, electrolytic plating is sometimes referred to as electroplating.

BACKGROUND ART

Seed plating to insulating parts of printed circuit boards has conventionally been conducted primarily by electroless copper plating processes. A representative process is to apply electroless copper plating by adopting, as a pretreatment process, a process that uses a Pd—Sn alloy colloid as a catalyst or an alkaline Pd ion solution as a catalyst and conducts metallization of Pd in a solution of a reducing agent in a subsequent step. By this plating process, insulating parts of most printed circuit boards can be rendered conductive. There is, however, an increasing difficulty with flexible substrates or rigid flex substrates employed in cellular phones, digital cameras, HD or DVD systems, and the like. As a reason for this increasing difficulty, it can be mentioned that many electroless copper plating solutions are highly alkaline and that in these alkaline solutions, polyimide materials generate functional groups such as amino groups, hydroxyl groups, carbonyl groups and/or carboxyl groups to have hydrophilicity and are hence provided with higher hygroscopicity. Due to this property, long-term treatment with an electroless copper plating solution of high alkalinity results in the penetration of the plating solution into the polyimide substrate, and subsequent to the plating treatment, the penetrated plating solution remains between the resulting plating film and the polyimide substrate and oxidizes the copper, thereby developing a problem that an adhesion failure is induced. In addition, an adhesive layer employed in such a substrate is prone to dissolution in the alkaline solution and the dissolved matter causes a reduction in the deposition rate of electroless copper plating, leading to shortening of the solution life.

With a view to resolving such problems, there are now many processes making use of direct plating that does not use an electroless copper plating solution of high alkalinity and conducts electroplating to workpieces without applying electroless copper plating.

Japanese Patent No. 2660002 (Patent Document 1) describes a process that can apply electroplating by converting a Pd—Sn colloid catalyst into a metal chalcogenide compound film by sulfuration treatment.

Japanese Patent No. 2799076 (Patent Document 2) describes a process that subsequent to treatment with a colloidal acidic solution of a noble metal stabilized with an organic polymer, conducts sulfuration treatment to effect metal coating under galvanic action.

Japanese Patent No. 3117216 (Patent Document 3) describes a process that, after a thin oxide film layer is formed in an aqueous solution of potassium permanganate which has been adjusted to pH 0 to 6 with a sulfonic acid or the like, a conductive polymer layer of a pyrrole derivative is formed, followed by electrolytic plating.

Each of Japanese Patent No. 3284489 (Patent Document 4) and Japanese Patent No. 3261569 (Patent Document 5) describes a process that causes a carbon layer to deposit on a surface, conducts treatment in an acidic solution to remove carbon from a copper surface, and applies electrolytic plating.

Practically without exception, however, many of these pretreatment processes require a copper etching step after the step that forms a conductive layer, because in the case of a workpiece composed of insulating parts and copper parts as in a printed circuit board having through-holes and/or via-holes, a component employed to form a conductive layer on the copper substitutes or adsorbs, leading to a potential problem of a reduction in the reliability of connection between the copper existing on the substrate and the copper plating film unless a step is included to remove the component. Further, the copper etching treatment is technically considered to be more difficult than an ordinary dissolution step for copper, because the component employed for the formation of the conductive layers still remains in adhesion on the copper. Furthermore, the conductive layers applied to the insulating parts are accompanied by a potential problem that they may be dissolved or caused to fall off to some extent by the above-described copper etching treatment and also by acid cleaning as pretreatment for copper sulfate plating.

Other patent documents and general publications also include those which describe neutral electroless copper plating solutions. It is, however, the current situation that they have not arrived yet on the market, since they require the use of costly reducing agents and also difficult efforts for the maintenance of solution stability.

Patent Document 1: Japanese Patent No. 2660002
Patent Document 2: Japanese Patent No. 2799076
Patent Document 3: Japanese Patent No. 3117216
Patent Document 4: Japanese Patent No. 3284489
Patent Document 5: Japanese Patent No. 3261569

DISCLOSURE OF THE INVENTION

Problems to be Solved by the Invention

With the foregoing circumstances in view, the present invention has as objects thereof the provision of a direct plating process for directly conducting electrolytic copper plating without conducting electroless copper plating by forming a palladium conductor layer on an insulating part or insulating parts of a workpiece such as a printed circuit board and also the provision of a palladium conductor layer forming solution for use in the direct plating.

Means for Solving the Problems

To achieve the above-described objects, the present inventors have enthusiastically carried out an investigation, and as a result, have found that by subjecting a surface of a workpiece, which includes an insulating part, to palladium catalyst treatment to apply a palladium catalyst onto the surface at the insulating part and then forming a palladium conductor layer on the insulating part in a palladium conductor layer forming solution containing a palladium compound, an amine compound and a reducing agent, while using the thus-applied palladium as a catalyst, direct electrolytic copper plating is feasible on the palladium conductor layer without interposition of an electroless copper plating film, also that, although such a process is effective for the conductivity-imparting treatment of insulating part(s) in a workpiece in which a section to be subjected to plating includes insulating part(s) and copper part(s) as in a printed circuit board having through-holes and/or via-holes, the incorporation of an azole compound in the palladium conductor layer forming solution makes it possible to selectively form palladium conductor layer(s) on only the insulating part(s) without formation of palladium conductor layer(s) on the copper part(s).

Described in further detail, an adverse effect is given to a polyimide of low alkali resistance in conventional electroless copper plating treatment. Described specifically, it is presumed that an electroless copper plating solution of high alkalinity erodes a polyimide surface and subsequent to electroless copper plating treatment, exudation of the plating solution onto the polyimide surface oxidizes the electroless copper plating film to reduce the adhesion of the plating.

To resolve these problems, the present invention provides a process in which subsequent to the application of a palladium catalyst onto an insulator, a conductor layer of palladium is formed further. Preferably, a palladium catalyst is applied onto an insulator with an acidic palladium colloid catalyst, and then, a palladium conductor layer is formed in a palladium conductor layer forming solution which contains a palladium compound, an amine compound and a reducing agent. Further, this palladium conductor layer forming solution can form the palladium conductor layer at near-neutral pH, and the use of a palladium conductor layer forming solution with an azole compound contained therein precludes the formation of a palladium conductor layer onto copper. These can be attributed to the fact that, even if palladium is not applied or is applied only a little on copper as a result of the use of an acidic palladium colloid or the like for the application of the palladium catalyst, this does not cause any substantial problem in the palladium conductor layer forming treatment and also to the contrivance that prevents the formation of a palladium conductor layer on the copper owing to the incorporation of the azole compound in the palladium conductor layer forming solution.

As described above, the present invention conducts the impartation of conductivity with the above-described neutral palladium conductor layer forming solution without using an electroless copper plating solution of high alkalinity, and therefore, does not erode the polyimide and gives no adverse effect to the adhesion. Further, the palladium conductor layer may be dried once and may then be subjected to electrolytic copper plating as a next step, instead of using continuous treatment that the palladium conductor layer is immediately subjected to copper plating. In addition, the addition of the azole compound to the palladium conductor layer forming solution precludes the formation of a palladium conductor layer on the copper so that the connection between the copper part existing on the substrate and the electrolytic copper plating film (hereinafter referred to as "copper-copper connection") is provided with very high reliability.

It is to be noted that in the conventional patent documents relating to electroless palladium plating, the dip plating of insulating parts in a plating solution is described to be feasible by imparting catalytic properties to the insulating parts in accordance with the conventionally-known sensitizing activator method, catalyst accelerator method or the like. However, there is not known any undercoating step that applies a palladium catalyst to resin parts of an entirety called "a printed circuit board", such as its surface and TH and BVH, for the purpose of subsequently conducting the formation of palladium conductor layers only for obtaining conductivity and further conducting electrolytic copper plating to the insulating parts such as the resin parts via the palladium conductor layers. There is also unknown the contrivance that selectively forms palladium conductor layers on only insulating parts and precludes the formation of palladium conductor layers on metal parts such as copper, that is, a palladium conductor layer forming solution or electroless palladium plating solution contrived to preclude dissolution of the copper existing on the surface of a substrate.

The present invention, therefore, provides the following direct plating processes and palladium conductor layer forming solutions.

Item 1:
A direct plating process for applying electrolytic copper plating to an insulating part of a workpiece having the insulating part, which is characterized by subjecting a surface of the workpiece to palladium catalyst treatment to apply a palladium catalyst onto the surface at the insulating part, forming a palladium conductor layer on the insulating part with a palladium conductor layer forming solution, which includes a palladium compound, an amine compound and a reducing agent, while using the thus-applied palladium as a catalyst, and then forming an electrolytic copper plating film directly on the palladium conductor layer.

Item 2:
The direct plating process according to item 1, wherein the workpiece is made of a polyimide as a base material.

Item 3:
The direct plating process according to item 1 or 2, wherein a section of the workpiece, the section being to be subjected to the plating treatment, includes an insulating part and a copper part, the palladium conductor layer forming solution further includes an azole compound, and by treating the workpiece with the palladium conductor layer forming solution, a palladium conductor layer is selectively formed on only the insulating part without formation of the palladium conductor layer on the copper part.

Item 4:
The direct plating process according to item 3, wherein the azole compound is benzotriazole.

Item 5:
The direct plating process according to item 3 or 4, wherein the workpiece is a printed circuit board having through-holes and/or via-holes.

Item 6:
The direct plating process according to any one of items 1-5, wherein the palladium conductor layer forming solution has a pH not higher than 8.

Item 7:
The direct plating process according to any one of items 1 to 6, wherein the application of the palladium catalyst is conducted by treatment with an acidic palladium colloid solution dispersed and stabilized with an organic polymer.

Item 8:
A palladium conductor layer forming solution for use in direct plating, is characterized by including a palladium compound, an amine compound and a reducing agent.

Item 9:
The palladium conductor layer forming solution according to item 8, which further includes an azole compound.

Item 10:
The palladium conductor layer forming solution according to item 9, wherein the azole compound is benzotriazole.

Item 11:
The palladium conductor layer forming solution according to any one of items 8 to 10, which has a pH not higher than 8.

Effects of the Invention

The direct plating process and palladium conductor layer forming solution according to the present invention have the following advantageous effects.

(1) A conductor layer (palladium conductor layer) is formed in a short time in a neutral solution, and therefore, no penetration of the solution into polyimide takes place even when a workpiece made of a polyimide base material is used.

(2) The conductor layer on the polyimide is formed with palladium, and therefore, no metal oxide is generated with time so that the conductor layer is excellent in adhesion.

(3) Palladium is more resistant to oxidation than copper, and therefore, sufficient conductivity is obtained with a layer thickness of 5 to 50 nm or so and no long hours dipping in the treatment solution is needed.

(4) Palladium is superior in corrosion resistance to copper, and therefore, long term storage is feasible after the formation of the palladium conductor layer until electrolytic copper plating treatment such as copper sulfate plating.

(5) A step by conventional electroless copper plating pretreatment can also be used.

(6) The use of a palladium conductor layer forming solution with an azole compound contained therein obviates etching after the formation of a conductor layer, because no conductor layer exists on a copper part of a surface of a workpiece.

(7) The reliability of copper-copper connection is high, since no conductor layer exists on the copper part as mentioned above.

Best Modes for Carrying Out the Invention

As mentioned above, the direct plating process according to the present invention is to form an electrolytic copper plating film on an insulating part of a workpiece. By subjecting the workpiece to palladium catalyst treatment at a surface thereof, a palladium catalyst is applied to the surface at the insulating part. Using the thus-applied palladium as a catalyst, a palladium conductor layer is then formed with a palladium conductor layer forming solution which contains a palladium compound, an amine compound and a reducing agent. Subsequently, an electrolytic copper plating film is formed directly on the palladium conductor layer at the insulating part.

The workpiece can be one in which a section to be subjected to plating treatment is insulating in its entirety, or can be one in which a section to be subjected to plating treatment includes both an insulating part and a copper part, for example, a printed circuit board or the like having a copper film with through-holes and/or via-holes formed therethrough, specifically a rigid flex substrate, full-surface resinous build-up substrate or like substrate having a polyimide as a material.

In the present invention, conventional methods can be adopted for the pretreatment steps up to the palladium catalyst treatment. In the case of a printed circuit board having a copper film, for example, it is possible to adopt such a process that after conducting conditioning with an alkaline cleaner such as amine compounds including a nonionic surfactant and/or cationic surfactant, copper etching is conducted with an etchant containing an oxidizing agent and an acid, followed by acid cleaning or the like.

Further, the palladium catalyst treatment to the insulating part of the workpiece can also be conducted by a known method, for example, by using one of the sensitizing activator method, the Pd—Sn colloid catalyst, an alkaline Pd ion catalyst and an acidic Pd colloid catalyst, all of which are known conventionally.

In this case, the most preferred in view of shortening of the number of steps and cost is an acidic Pd colloid solution dispersed and stabilized with an organic polymer, because the Pd—Sn colloid catalyst requires a step for the removal of Sn which has a potential problem of impairing the reliability of copper-copper connection and the alkaline Pd ion catalyst requires a Pd-reducing step after the treatment.

It is to be noted that as an activator for use in the application of such a palladium catalyst, an activator can be prepared with a known composition or a commercial product can be used. As conditions for the treatment with the activator, known usual conditions can be adopted.

Next, the palladium conductor layer forming solution for the formation of the palladium conductor layer contains a palladium compound in a form complexed with an amine compound and also a reducing agent.

As the palladium compound to be used, a known palladium compound can be used, and a water-soluble palladium compound such as palladium oxide, palladium chloride, palladium nitrate, palladium acetate, sodium palladium chloride, potassium palladium chloride, ammonium palladium chloride, palladium sulfate or tetraamminepalladium chloride can be mentioned. The use concentration of the palladium compound may preferably in a range of 0.0001 to 0.01 mol/L, with 0.0005 to 0.002 mol/L being most preferred. At a concentration lower than 0.0001 mol/L, the rate at which a palladium conductor layer is formed becomes slower. When the concentration is excess of 0.01 mol/L, on the other hand, the process becomes costly in economy, and at a palladium concentration higher than 0.01 mol/L, there is a potential problem that palladium may substitute or precipitate on copper.

The palladium conductor layer forming solution for use in the present invention may preferably use at least one kind of amine compound to stably form and maintain a complex of palladium. As the pH of the palladium conductor layer forming solution is maintained around 7 in this case, a compound capable of stably forming a complex at the pH is selected. The concentration of the amine compound may be preferably 0.0001 to 0.1 mol/L, more preferably 0.001 to 0.02 mol/L. The amine compound contributes more to the stability of the solution as its concentration becomes higher. At a concentration higher than 0.1 mol/L, however, the amine compound exhibits stronger dissolution power for the copper on the substrate so that the concentration of copper in the palladium conductor layer forming solution rises. When the concentration of copper rises, the formation rate of the conductor layer drops, leading to a potential problem that the life of the palladium conductor layer forming solution may be shortened. At a concentration lower than 0.0001 mol/L, on the other hand, no palladium complex is formed, leading to a potential problem that the palladium conductor layer forming solution may be brought into a suspended state and may eventually form a precipitate.

Examples of the amine compound include monoamines such as methylamine, ethylamine, propylamine, trimethylamine and dimethylethylamine, diamines such as methylenediamine, ethylenediamine, tetramethylenediamine and hexamethylenediamine, polyamines such as diethylenetriamine, triethylenetetramine and pentaethylenehexamine, and in addition, amino acids and the like such as ethylenediaminetetraacetic acid and its sodium salt, potassium salt and ammonium salt, nitrilotriacetic acid and its sodium salt, potassium salt and ammonium salt, glycine, and iminodiacetic acid.

For an improvement in stability, it is also desired to add an aliphatic carboxylic acid. Illustrative are monocarboxylic acids such as formic acid, acetic acid, propionic acid, butyric acid, isobutyric acid, valeric acid and isovalelic acid, dicarboxylic acids such as oxalic acid, malonic acid, succinic acid, glutaric acid, maleic acid, fumaric acid, citraconic acid, itaconic acid, and other carboxylic acids such as tricarballylic acid, glycolic acid, lactic acid, malic acid, tartaric acid, citric acid, isocitric acid, alloisocitric acid, gluconic acid, oxalacetic acid and diglycolic acid, and the sodium salts, potassium salts, ammonium salts and the like of these carboxylic acids.

One or more of the above-described carboxylic acids and salts can be used. Its concentration may be preferably 0.0001 to 0.1 mol/L, more preferably 0.001 to 0.02 mol/L. At a concentration lower than 0.0001 mol/L, its effect as a stabilizer is weak. At a concentration higher than 0.1 mol/L, on the other hand, its role as a stabilizer is saturated so that such a high concentration requires wasteful cost and is not practical from the standpoint of economy.

As the reducing agent, a known reducing agent can be used. Illustrative are hypophosphorous acid and its salts, boron hydride and its salts, dimethylamineboran, trimethylamineboran, hydrazine, and the like.

The above-described reducing agent acts as a reducing agent for palladium ions in the palladium conductor layer forming solution for use in the present invention, and its concentration may be preferably 0.01 to 1 mol/L, more preferably 0.05 to 0.5 mol/L. A concentration lower than 0.01 mol/L leads to a reduction in reaction velocity, while a concentration higher than 1 mol/L has a potential problem that the palladium conductor layer forming solution may become unstable.

To avoid the formation of a palladium conductor layer on the surface of each copper part of the workpiece, it is preferred to add an azole compound to the palladium conductor layer forming solution for use in the present invention. The azole compound is adsorbed on the copper to suppress the dissolution of the copper by the amine, thereby inhibiting the substitution reaction of palladium onto the copper so that a palladium conductor layer is formed on the insulating part only.

Examples of the azole compound for use in the present invention include imidazoles such as imidazole, 2-phenylimidazole, 1-vinylimidazole, benzoimidazole, 2-butylbenzoimidazole, 2-phenylethylbenzoimidazole and 2-aminobenzoimidazole, triazoles such as 1,2,4-triazole, 3-amino-1,2,4-triazole, 1,2,3-benzotriazole, 1-hydroxybenzotriazole and carboxybenzotriazole, tetrazoles such as tetrazole, 5-phenyl-1H-tetrazole, 5-methyl-1H-tetrazole and 5-amino-1H-tetrazole, pyrazole, and benzothiazole. 1,2,3-benzotriazole is particularly preferred.

Two or more of the above-described azole compounds may be used in combination. The concentration of the azole compound may be preferably 0.0001 to 0.2 mol/L, more preferably 0.0002 to 0.02 mol/L. At a concentration lower than 0.0001 mol/L, the substitution or precipitation of palladium on copper takes place, leading to the potential problem that the reliability of copper-copper connection may be impaired. Or, there is the possibility that the formation of a palladium conductor layer may not be smoothly conducted due to the dissolution of copper into the solution. A concentration higher than 0.2 mol/L causes no problem insofar as the azole compound is dissolved, but is not practical from the standpoint of cost.

The palladium conductor layer forming solution for use in the present invention can be used suitably at pH 8 or lower, notably at a pH range of 6 to 8. In this pH range, a good palladium conductor layer can be formed. At lower than pH 6, the formation of an amine complex is suppressed so that a difficulty may arise in the formation of a palladium conductor layer. When the pH exceeds 8, on the other hand, the dissolution of copper takes place, leading to a potential problem that the formation of a conductor layer on an insulating material may be suppressed. As the treatment temperature, a range of 20 to 80° C. can be used. Especially at 40° C. or higher, a good palladium conductor layer can be formed in a short time. At lower than 20° C., the reaction may not initiate in some instances, and no uniform palladium conductor layer may be formed accordingly. When the treatment temperature exceeds 80° C., the stability of the solution may be lowered in some instances. It is to be noted that the treatment time with the palladium conductor layer forming solution may be preferably 0.5 to 5 minutes, notably 1 to 3 minutes or so.

In the present invention, a palladium conductor layer is formed in the palladium conductor layer forming solution, which contains the above-described reducing agent, while using as a catalyst the palladium applied to the insulating part. In this case, the palladium conductor layer has a thickness of 5 to 50 nm or so, and has conductivity sufficient to conduct electrolytic copper plating. By adding the azole compound, the compound adheres to the copper and protects it, thereby reducing the copper-dissolving action of the palladium conductor layer forming solution and the substitution and deposition of palladium. As a consequence, it is possible to assure high reliability for the copper-copper connection.

After the palladium conductor layer is formed as described above, copper plating is conducted. Since the palladium conductor layer has already been formed on the insulating part of the workpiece in this case, electrolytic copper plating can be conducted directly onto the palladium conductor layer without additionally applying electroless copper plating to the insulating part. In particular, it is unnecessary to interpose an electroless copper plating which uses an alkaline electroless copper plating solution.

The plating solution for use in such electrolytic copper plating can have a known composition, and a commercial product can be used. Further, as conditions for the plating, known usual conditions can be adopted. It is to be noted that the electrolytic copper plating may preferably be, but is not limited to, copper sulfate plating.

EXAMPLES

Examples and Comparative Examples will hereinafter be given to specifically describe the present invention. It is, however, to be noted that the present invention is not limited to the following Examples.

As steps up to the application of a palladium catalyst before the formation of a palladium conductor layer, the steps No. 1 to No. 3 shown in Table 1 were conducted separately. As palladium conductor layer forming solutions for forming palladium conductor layers, those having the compositions A to D shown in Table 2 were employed separately.

TABLE 1

| Step | No. 1 | No. 2 | No. 3 |
|---|---|---|---|
| Cleaning | "WCD"[(1)]: 50 mL/L 50° C. × 5 min | "WCD"[(1)]: 50 mL/L 50° C. × 5 min | "WCD"[(1)]: 50 mL/L 50° C. × 5 min |
| Hot-water rinsing | 50° C. × 1 min | 50° C. × 1 min | 50° C. × 1 min |
| Water rinsing | Room temp. × 1 min | Room temp. × 1 min | Room temp. × 1 min |

TABLE 1-continued

| Step | No. 1 | No. 2 | No. 3 |
|---|---|---|---|
| Etching | 35% $H_2O_2$: 50 mL/L<br>62.5% $H_2SO_4$: 160 mL/L<br>"MSE-7"[2]: 50 mL/L<br>40° C. × 2 min | 35% $H_2O_2$: 50 mL/L<br>62.5% $H_2SO_4$: 160 mL/L<br>"MSE-7"[2]: 50 mL/L<br>40° C. × 2 min | 35% $H_2O_2$: 50 mL/L<br>62.5% $H_2SO_4$: 160 mL/L<br>"MSE-7"[2]: 50 mL/L<br>40° C. × 2 min |
| Water rinsing | Room temp. × 1 min | Room temp. × 1 min | Room temp. × 1 min |
| Acid cleaning | 62.5% $H_2SO_4$: 100 mL/L<br>Room temp. × 1 min | 62.5% $H_2SO_4$: 100 mL/L<br>Room temp. × 1 min | 62.5% $H_2SO_4$: 100 mL/L<br>Room temp. × 1 min |
| Water rinsing | Room temp. × 1 min | Room temp. × 1 min | Room temp. × 1 min |
| Pre-dipping | — | — | "PED-104"[9]: 270 g/L<br>25° C. × 2 min |
| Catalyst treatment | "WAT"[3]: 50 mL/L<br>"WHP"[4]: 5 mL/L<br>40° C. × 5 min | "MAT-2A"[5]: 200 mL/L<br>"MAT-2B"[6]: 40 mL/L<br>60° C. × 5 min | "AT-105"[10]: 30 mL/L<br>"PED-104"[9]: 270 g/L<br>30° C. × 8 min |
| Water rinsing | Room temp. × 1 min | Room temp. × 1 min | Room temp. × 1 min |
| Sn removal | — | — | "AT-106"[11]: 100 mL/L<br>25° C. × 3 min |
| Water rinsing | — | — | Room temp. × 1 min |
| Reduction | — | "MAB-4A"[7]: 20 mL/L<br>"MAB-4B"[8]: 200 mL/L<br>35° C. × 3 min | — |
| Water rinsing | — | Room temp. × 1 min | — |

[1]An alkaline solution of amine compounds including a nonionic surfactant and a cationic surfactant
[2]A stabilizer for hydrogen peroxide
[3]An acidic palladium colloid solution (palladium solution)
[4]An acidic palladium colloid solution (reducing agent)
[5]An alkaline solution of a palladium complex (palladium solution)
[6]An alkaline solution of a palladium complex (chelating agent)
[7]A dimethylamineboran solution
[8]A pH adjuster (buffer)
[9]A Pd—Sn colloid solution (stabilizer)
[10]A Pd—Sn colloid solution (Pd—Sn solution)
[11]A boron fluoride solution
* The chemicals (1) to (11) are products of C. Uyemura & Co., Ltd.

TABLE 2

| A | | B | | C | | D | |
|---|---|---|---|---|---|---|---|
| $PdCl_2$ | 185 ppm | $PdCl_2$ | 370 ppm | $Pd(NH_3)_4Cl_2$ | 370 ppm | $Pd(NH_3)_4Cl_2$ | 370 ppm |
| EDA[12] | 1 g/L | EDA | 2 g/L | EDA | 2 g/L | EDA | 2 g/L |
| BTA[13] | 100 ppm | BTA | 200 ppm | BTA | 200 ppm | | |
| Na hypo-phosphite | 5 g/L | Na hypo-phosphite | 5 g/L | Na hypo-phosphite | 5 g/L | Na hypo-phosphite | 5 g/L |
| Maleic acid | 1 g/L | Fumaric acid | 1 g/L | Succinic acid | 1 g/L | Maleic acid | 1 g/L |

[12]Ethylenediamine
[13]1,2,3-Benzotriazole

Example 1

The palladium conductor layer forming solution slightly dissolves copper owing to the amine compound. As a result of the dissolution of copper, a copper complex is formed. By the copper complex, the formation of a palladium conductor layer is suppressed so that no good and conductive palladium conductor layer can be obtained. Azole compounds were therefore added as chemicals that suppress the dissolution of copper. To solutions shown under "D" in Table 2, BTA (1,2,3-benzotriazole), triazole, hydroxybenzotriazole and phenyl-benzotriazole were added at 0.002 mol/L, respectively, and in 500 mL aliquots of the resulting solutions, FR-4 substrates were dipped over 1 $dm^2$, respectively, and were left over at 50° C. for 14 hours. As a result, copper-dissolution suppressing effect was observed on the solutions with the corresponding azole compounds added in the same amount therein in comparison with the solution to which no azole compound was added. Especially on BTA, this effect was observed pronouncedly. The results are shown in Table 3.

TABLE 3

| | Not added | BTA | Triazole | Hydroxy-benzotriazole | Phenyl-benzotriazole |
|---|---|---|---|---|---|
| Amount of copper dissolved (ppm) | 49.8 | 2.7 | 33.3 | 26.3 | 10.2 |
| Dissolution rate of copper (ppm/hr) | 3.5 | 0.2 | 2.4 | 1.9 | 0.7 |

Example 2

A specimen, which had been prepared by completely dissolving off a surface-laminated copper foil from a commercial product (FR-4) through etching, and two types of 75-μm polyimide films ("KAPTON," product of E.I. du Pont de Nemours and Company; and "UPILEX," product of Ube Industries, Ltd.) were treated with the Sn-free, acidic palladium colloid solution shown under No. 1 in Table 1, and palladium conductor layers were then formed under the conditions of pH 7, 50° C. and 2 minutes in the palladium conductor layer forming solution shown under "A" in Table 2. As a result, the palladium conductor layers were formed with a thickness of 8 nm on the resins of all of the FR-4 and the two types of polyimide films, respectively, and were found to have 500 mΩ as conduction resistance across 100 mm (width: 50 mm). In tape tests, those palladium conductor layers were confirmed to remain free from peeling.

Subsequently, electrolytic copper plating was conducted to 25 μm at a cathode current density of 2.5 A/dm$^2$ in an electrolytic copper plating solution which contains copper sulfate pentahydrate (80 g/L), sulfuric acid (200 g/L), chloride ions (60 ppm), and "EPL-1-4A" (0.5 mL/L) and "EPL-1-B" (20 mL/L) [additives for cupper sulfate plating; products of C. Uyemura & Co., Ltd.]. Copper was completely applied onto the entire surfaces of the resins of all of the FR-4 and the two types of polyimide films. Further, those samples were subjected at 150° C. for 1 hour to heat treatment, but no blister occurred.

Example 3

With respect to a commercial product (FR-4 substrate) (0.3 mm in diameter, 1.6 mm in thickness), a two-layered polyimide plate (material: "UPILEX") and a three-layered polyimide plate (material: "KAPTON") in all of which through-holes were formed, similar treatments as in Example 2 were conducted up to copper sulfate plating. As a result, copper sulfate plating films were completely applied into the through-holes without any problem.

Example 4

A specimen, which had been prepared by completely dissolving off a surface-laminated copper foil from a commercial product (FR-4) through etching, and two types of 75-μm polyimide films ("KAPTON" and "UPILEX") were treated with the alkaline palladium-complex solution with the Sn-free shown under No. 2 in Table 1, and palladium conductor layers were then formed under the conditions of pH 7, 50° C. and 2 minutes in the palladium conductor layer forming solution shown under "B" in Table 2. As a result, the palladium conductor layers were formed with a thickness of 8 nm on the resins of all of the FR-4 and the two types of polyimide films, respectively, and were found to have 1 kΩ as conduction resistance across 100 mm (width: 50 mm). In tape tests, those palladium conductor layers were confirmed to remain free from peeling.

Subsequently, electrolytic copper plating was conducted to 25 μm thickness at a cathode current density of 2.5 A/dm$^2$ in an electrolytic copper plating solution which contains copper sulfate pentahydrate (80 g/L), sulfuric acid (200 g/L), chloride ions (60 ppm), and "EPL-1-4A" (0.5 mL/L) and "EPL-1-B" (20 mL/L) [additives for cupper sulfate plating; products of C. Uyemura & Co., Ltd.]. Copper was completely applied onto the entire surfaces of the resins of all of the FR-4 and the two types of polyimide films. Further, those samples were subjected at 150° C. for 1 hour to heat treatment, but no blister occurred.

Example 5

With respect to a commercial product (FR-4 substrate) (0.3 mm in diameter, 1.6 mm in thickness), a two-layered polyimide plate (material: "UPILEX") and a three-layered polyimide plate (material: "KAPTON") in all of which through-holes were formed, similar treatments as in Example 4 were conducted up to copper sulfate plating. As a result, copper sulfate plating films were completely applied into the through-holes without any problem.

Example 6

A specimen, which had been prepared by completely dissolving off a surface-laminated copper foil from a commercial product (FR-4) through etching, and two types of 75-μm polyimide films ("KAPTON" and "UPILEX") were treated with the Pd—Sn colloid solution shown under No. 3 in Table 1, and palladium conductor layers were then formed under the conditions of pH 7, 50° C. and 2 minutes in the palladium conductor layer forming solution shown under "C" in Table 2. As a result, the palladium conductor layers were formed with a thickness of 10 nm on the resins of all of the FR-4 and the two types of polyimide films, respectively, and were found to have 830 mΩ as conduction resistance across 100 mm (width: 50 mm). In tape tests, those palladium conductor layers were confirmed to remain free from peeling.

Subsequently, electrolytic copper plating was conducted to 25 μm thickness at a cathode current density of 2.5 A/dm$^2$ in an electrolytic copper plating solution which contains copper sulfate pentahydrate (80 g/L), sulfuric acid (200 g/L), chloride ions (60 ppm), and "EPL-1-4A" (0.5 mL/L) and "EPL-1-B" (20 mL/L) [additives for cupper sulfate plating; products of C. Uyemura & Co., Ltd.]. Copper was completely applied onto the entire surfaces of the resins of all of the FR-4 and the two types of polyimide films. Further, those samples were subjected at 150° C. for 1 hour to heat treatment, but no blister occurred.

Example 7

With respect to a commercial product (FR-4 substrate) (0.3 mm in diameter, 1.6 mm in thickness), a two-layered polyimide plate (material: "UPILEX") and a three-layered polyimide plate (material: "KAPTON") in all of which through-holes were formed, similar treatments as in Example 6 were conducted up to copper sulfate plating. As a result, copper sulfate plating films were completely applied into the through-holes without any problem.

Comparative Example 1

Two types of 75-μm polyimide films ("KAPTON" and "UPILEX") were treated with the Pd—Sn colloid solution shown under No. 3 in Table 1, and were then subjected to electroless copper plating under the conditions of 35° C. and 20 minutes with a general electroless copper plating solution. As a result, copper plating films were formed on the entire surfaces without blister. However, those films had no adhesion with the polyimide, and were confirmed to be instantaneously peeled off in tape tests.

Comparative Example 2

A specimen, which had been prepared by completely dissolving off a surface-laminated copper foil from a commercial product (FR-4) through etching, and two types of 75-μm polyimide films ("KAPTON" and "UPILEX") were treated with the acidic Pd colloid solution shown under No. 1 in Table 1, and their conduction resistances across 100 mm (width: 50 mm) were measured without conducting any palladium conductor layer forming treatment. However, no conductivity was obtained and the measurement was impossible.

Subsequently, electrolytic copper plating was conducted to 25 μm thickness at a cathode current density of 2.5 A/dm² in an electrolytic copper plating solution which contains copper sulfate pentahydrate (80 g/L), sulfuric acid (200 g/L), chloride ions (60 ppm), and "EPL-1-4A" (0.5 mL/L) and "EPL-1-B" (20 mL/L) [additives for cupper sulfate plating; products of C. Uyemura & Co., Ltd.]. No copper plating film deposited on the resins of all of the FR-4 and the two types of polyimide films.

The invention claimed is:

1. A direct plating process for applying copper electroplating to an insulating part of a workpiece having said insulating part and a copper part at a surface of the workpiece comprising the steps of:
    subjecting the surface of said workpiece to palladium catalyst treatment so as to apply a palladium catalyst onto the insulating part;
    forming a palladium conductor layer on the palladium catalyst on said insulating part of said workpiece by treating the surface having said insulating part and copper part with a palladium conductor layer forming solution, which comprises a palladium compound, an amine compound, a reducing agent and an azole compound, while using the palladium catalyst; and
    then electroplating a copper film directly on said palladium conductor layer, wherein
    said azole compound is selected from the group consisting of an imidazole compound, a triazole compound, a tetrazole compound and a pyrazole compound,
    said reducing agent is selected from the group consisting of hypophosphorous acid and its salts, boron hydride and its salts, dimethylamineboran, and trimethylamineboran, and
    the azole compound is adsorbed to the copper part of said workpiece and inhibits a substitution reaction of palladium onto the copper part of said workpiece in the forming step so that the palladium conductor layer is selectively formed on only the palladium catalyst on said insulating part of said workpiece without forming a palladium conductor layer on said copper part of said workpiece.

2. The direct plating process according to claim 1, wherein said workpiece comprises a polyimide as said insulating part.

3. The direct plating process according to claim 1, wherein said azole compound is the triazole compound, and the triazole compound is a benzotriazole compound, and
    said palladium conductor layer forming solution has a pH not higher than 8.

4. The direct plating process according to claim 3, wherein said benzotriazole compound is 1,2,3-benzotriazole.

5. The direct plating process according to claim 3, wherein a concentration of the palladium compound is in a range of 0.0001 to 0.01 mol/L.

6. The direct plating process according to claim 4, wherein a concentration of the palladium compound is in a range of 0.0001 to 0.01 mol/L.

7. The direct plating process according to claim 1, wherein said workpiece is a printed circuit board having through-holes and/or via-holes.

8. The direct plating process according to claim 1, wherein application of said palladium catalyst is conducted by the palladium catalyst treatment with an acidic palladium colloid solution dispersed and stabilized with an organic polymer.

9. The direct plating process according to claim 1,
    wherein said imidazole compound is selected from the group consisting of imidazole, 2-phenylimidazole, 1-vinylimidazole, benzoimidazole, 2-butylbenzoimidazole, 2-phenylethylbenzoimidazole, and 2-aminobenzoimidazole, and
    wherein said triazole compound is selected from the group consisting of 1,2,4-triazole, 3-amino-1,2,4-triazole, 1,2,3-benzotriazole, 1-hydroxybenzotriazole, and carboxybenzotriazole, wherein said tetrazole compound is selected from the group consisting of tetrazole, 5-phenyl-1H-tetrazole, 5-methyl-1H-tetrazole, and 5-amino-1H-tetrazole, and
    wherein said pyrazole compound is pyrazole, and
    wherein said palladium conductor layer forming solution has a pH not higher than 8.

10. The direct plating process according to claim 9, wherein a concentration of the palladium compound is in a range of 0.0001 to 0.01 mol/L.

11. The direct plating process according to claim 1, wherein a concentration of the palladium compound is in a range of 0.0001 to 0.01 mol/L.

* * * * *